US011088320B2

(12) United States Patent
Yang et al.

(10) Patent No.: US 11,088,320 B2
(45) Date of Patent: Aug. 10, 2021

(54) FABRICATION OF LARGE HEIGHT TOP METAL ELECTRODE FOR SUB-60NM MAGNETORESISTIVE RANDOM ACCESS MEMORY (MRAM) DEVICES

(71) Applicant: Taiwan Semiconductor Manufacturing Company, Ltd., Hsinchu (TW)

(72) Inventors: Yi Yang, Fremont, CA (US); Zhongjian Teng, Santa Clara, CA (US); Jesmin Haq, Milpitas, CA (US); Yu-Jen Wang, San Jose, CA (US)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 87 days.

(21) Appl. No.: 16/679,508

(22) Filed: Nov. 11, 2019

(65) Prior Publication Data
US 2020/0075847 A1 Mar. 5, 2020

Related U.S. Application Data

(63) Continuation of application No. 15/902,415, filed on Feb. 22, 2018, now Pat. No. 10,475,991.

(51) Int. Cl.
*H01L 27/22* (2006.01)
*H01L 43/12* (2006.01)
(Continued)

(52) U.S. Cl.
CPC .............. *H01L 43/12* (2013.01); *B82Y 25/00* (2013.01); *G11C 11/161* (2013.01);
(Continued)

(58) Field of Classification Search
CPC ....... H01L 43/08; H01L 27/222; H01L 43/12; H01L 43/10; G11C 11/161; B82Y 25/00
(Continued)

(56) References Cited

U.S. PATENT DOCUMENTS 6,395,621 B1   5/2002  Mizushima et al.
6,806,096 B1   10/2004 Kim et al.
(Continued)

FOREIGN PATENT DOCUMENTS

JP   2014130946 A   7/2014
WO   2016058008 A2  4/2016

*Primary Examiner* — Hrayr A Sayadian
(74) *Attorney, Agent, or Firm* — Haynes and Boone, LLP

(57) ABSTRACT

A process flow for forming magnetic tunnel junction (MTJ) cells with a critical dimension CD≤60 nm by using a top electrode (TE) hard mask having a thickness≥100 nm prior to MTJ etching is disclosed. A carbon hard mask (HM), silicon HM, and photoresist are sequentially formed on a MTJ stack of layers. A pattern of openings in the photoresist is transferred through the Si HM with a first reactive ion etch (RIE), and through the carbon HM with a second RIE. After TE material is deposited to fill the openings, a chemical mechanical process is performed to remove all layers above the carbon HM. The carbon HM is stripped and the resulting TE pillars are trimmed to a CD≤60 nm while maintaining a thickness proximate to 100 nm. Thereafter, an etch process forms MTJ cells while TE thickness is maintained at ≥70 nm.

20 Claims, 4 Drawing Sheets

(51) Int. Cl.
    *B82Y 25/00*     (2011.01)
    *G11C 11/16*     (2006.01)
    *H01L 43/10*     (2006.01)
    *H01L 43/08*     (2006.01)

(52) U.S. Cl.
    CPC ............ *H01L 27/222* (2013.01); *H01L 43/08* (2013.01); *H01L 43/10* (2013.01)

(58) Field of Classification Search
    USPC ........................................................ 257/421
    See application file for complete search history.

(56) References Cited

U.S. PATENT DOCUMENTS

| | | | |
|---|---|---|---|
| 6,984,529 B2 | 1/2006 | Stojakavic et al. | |
| 7,001,783 B2 | 2/2006 | Costrini et al. | |
| 7,060,194 B2 | 6/2006 | Kodaira et al. | |
| 7,169,654 B2 | 1/2007 | Zia et al. | |
| 7,471,445 B2 | 12/2008 | Pan | |
| 7,593,193 B2 | 9/2009 | Inomata et al. | |
| 7,696,551 B2 | 4/2010 | Xiao et al. | |
| 8,450,119 B2 | 5/2013 | Torng et al. | |
| 8,716,072 B2 | 5/2014 | Bangsaruntip et al. | |
| 8,722,543 B2 | 5/2014 | Belen et al. | |
| 8,971,507 B2 | 3/2015 | Takahashi et al. | |
| 9,142,761 B2 | 9/2015 | Huang et al. | |
| 9,166,154 B2 | 10/2015 | Satoh et al. | |
| 9,269,894 B2 | 2/2016 | Mudivarthi et al. | |
| 9,275,713 B2 | 3/2016 | Guo | |
| 9,362,490 B1 | 6/2016 | Xiao | |
| 9,525,125 B1 | 12/2016 | Annunziata et al. | |
| 2003/0073251 A1 | 4/2003 | Ning | |
| 2003/0206434 A1* | 11/2003 | Leuschner | G11C 11/1675 365/173 |
| 2005/0277207 A1 | 12/2005 | Costrini et al. | |
| 2007/0215911 A1 | 9/2007 | Torng et al. | |
| 2009/0078927 A1 | 3/2009 | Xiao et al. | |
| 2009/0159563 A1 | 6/2009 | Jung | |
| 2009/0261437 A1 | 10/2009 | Kang et al. | |
| 2010/0327248 A1 | 12/2010 | Khoueir et al. | |
| 2013/0157383 A1 | 6/2013 | Cho | |
| 2014/0235056 A1 | 8/2014 | Guha et al. | |
| 2016/0141489 A1 | 5/2016 | Zhang et al. | |
| 2016/0197268 A1* | 7/2016 | Yakabe | H01L 43/12 257/421 |
| 2016/0351798 A1 | 12/2016 | Shen et al. | |
| 2017/0256708 A1 | 9/2017 | Krounbi et al. | |
| 2019/0131346 A1* | 5/2019 | Lin | H01L 43/12 |
| 2019/0259941 A1 | 8/2019 | Yang et al. | |
| 2019/0386201 A1* | 12/2019 | Yang | H01F 41/308 |

\* cited by examiner

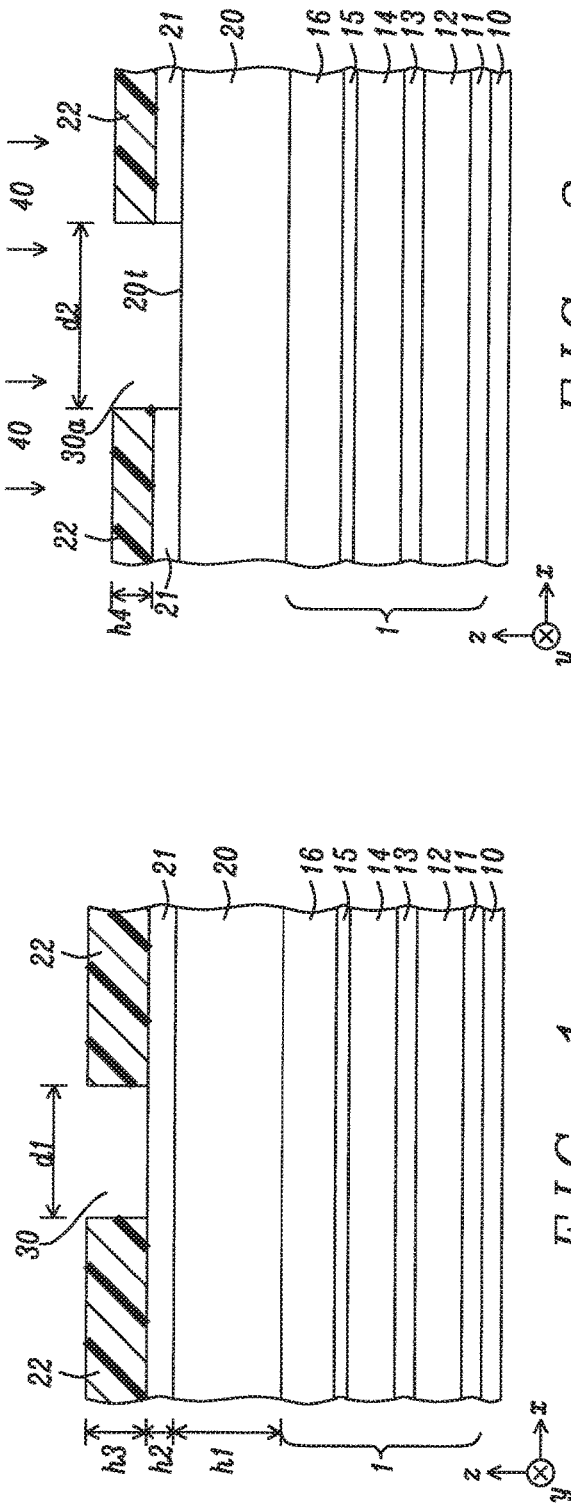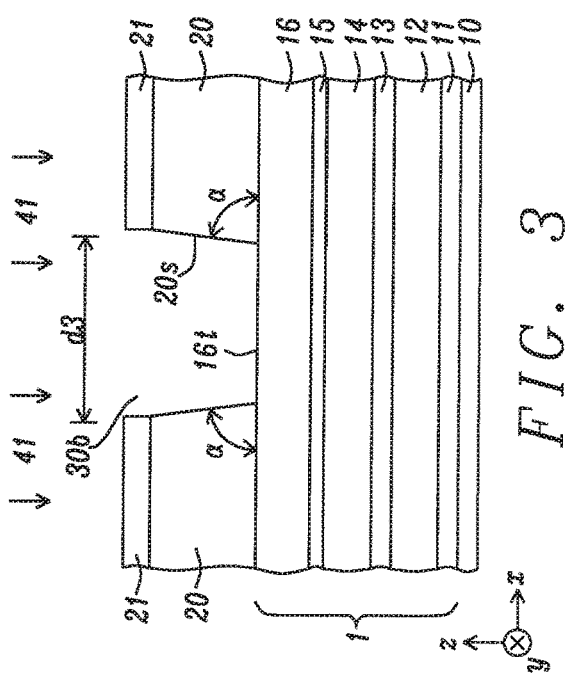

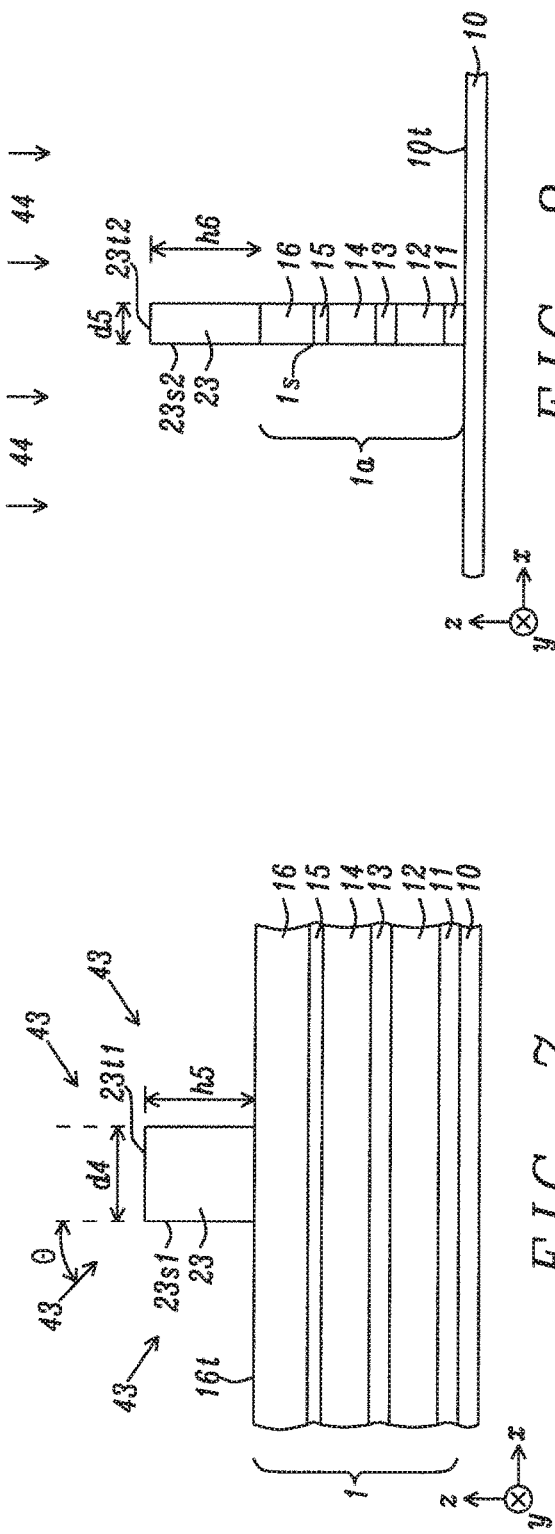

“FABRICATION OF LARGE HEIGHT TOP METAL ELECTRODE FOR SUB-60NM MAGNETORESISTIVE RANDOM ACCESS MEMORY (MRAM) DEVICES”

PRIORITY DATA

The present application is a continuation application and claims the benefit of U.S. Non-Provisional application Ser. No. 15/902,415, filed Feb. 22, 2018 and entitled "Fabrication of Large Height Top Metal Electrode for Sub-60 nm Magnetoresistive Random Access Memory (MRAM) Devices," which application is herein incorporated by reference in its entirety.

RELATED PATENT APPLICATION

This application is related to Docket# HT17-011, Ser. No. 15/668,113, filing date Aug. 3, 2017; which is assigned to a common assignee and herein incorporated by reference in its entirety.

TECHNICAL FIELD

The present disclosure relates to a process flow where metal vias are formed in a carbon hard mask and then trimmed with ion beam etching (IBE) after the hard mask is removed to yield top electrode pillars of sufficient height that provide an enhanced process window for subsequent etching and chemical mechanical polishing (CMP) processes that form magnetic tunnel junction (MTJ) devices with critical dimensions less than 60 nm.

BACKGROUND

A patterned MTJ stack of layers is also referred to as a MTJ nanopillar or MTJ cell and is a key component in memory devices such as magnetoresistive random access memory (MRAM) and spin torque transfer (STT)-MRAM. An important step in fabricating an array of MTJ cells is etch transfer of a pattern in an overlying top electrode through a MTJ stack of layers to form an array of MTJ cells with a critical dimension (CD) in one or both of a widthwise and lengthwise direction that in state of the art devices is substantially less than 100 nm. The etch transfer process typically comprises one or more etch steps involving reactive ion etching (RIE) and/or IBE.

A MTJ stack of layers includes two ferromagnetic layers called the free layer (FL) and reference layer (RL), and a dielectric layer (tunnel barrier) between the FL and RL. The RL has a fixed magnetization preferably in a perpendicular-to-plane direction (perpendicular magnetic anisotropy or PMA) while the FL is free to rotate to a direction that is parallel or anti-parallel to the RL magnetization direction thereby establishing a "0" or "1" memory state for the MTJ. The magnetoresistive ratio is expressed by dR/R where dR is the difference in resistance between the parallel state resistance (Rp) and the anti-parallel state resistance (Rap), and R is the minimum resistance value (Rp).

A top electrode made of a metal or metal nitride is generally formed on an uppermost capping layer in the MTJ, and serves as a protective layer (mask) during subsequent etching and CMP steps. A pattern comprised of a plurality of island shapes is typically generated in the top electrode by a process flow involving a photolithography process to produce a pattern in a photoresist layer, and then a plurality of etch steps to transfer the photoresist pattern through the top electrode and eventually through the MTJ stack of layers. The etch transfer is challenging since there is a variety of materials (magnetic alloys, non-magnetic metals, and dielectric films) in the MTJ stack that each have a different etch rate, and the top electrode should have a lower etch rate in each case to survive the entire pattern transfer process. Moreover, the top electrode must have sufficient thickness not only to ensure pattern integrity and adequate masking thickness during physical (IBE) and chemical (RIE) etching, but also serves in a similar capacity in the presence of chemical slurries (CMP) that are employed to planarize the MTJ array after an encapsulation layer is deposited to electrically insulate adjacent MTJ cells.

Usually a large height top electrode layer is covered with a thick dielectric hard mask formed so that the pattern transferred into the dielectric hard mask from the photoresist layer is effectively duplicated in the top electrode with an etch step. However, a relatively thick photoresist layer is necessary so that the initial pattern in the photoresist survives an etch transfer step through the thick hard mask. Unfortunately, conventional photoresist/hard mask combinations are not sufficiently selective when patterning top electrode materials such as Ta and TiN, especially, if a large aspect ratio (height/width) is required in the top electrode for a manufacturable process window when fabricating MTJ cells of <60 nm that are the basis of advanced MRAM products. In other words, the photoresist layer must have a thickness less than 150 nm for sub-60 nm patterns of island shapes to be formed therein with an adequate process window, but with current technology, photoresist films having a thickness substantially greater than 150 nm must be used to provide top electrodes of sufficient height to enable adequate process windows for etching MTJs with critical dimensions of <60 nm. As a result, a large aspect ratio (i.e. >150/60) often causes photoresist islands (pillars) to collapse, and a reduced process window. Therefore, a better MTJ fabrication flow is desired where top electrode (TE) pattern formation is compatible with a photoresist thickness from <150 nm to 200 nm, and the TE pattern has sufficient thickness to ensures an acceptable process window for forming <60 nm MTJ cells.

SUMMARY

One objective of the present disclosure is to provide a process flow for forming MTJ cells having a critical dimension (CD) less than 60 nm and with a process window that is suitable for manufacturing.

A second objective of the present disclosure is to provide a process flow according to the first objective that is readily implemented with existing tools and processes.

A third objective is to provide a MTJ structure having at least one critical dimension <60 nm that is fabricated with a larger process window and higher yields than MTJ structures in the prior art.

According to a preferred embodiment, these objectives are achieved by providing a MTJ stack of layers having at least a reference layer, a free layer, a tunnel barrier between the free layer and reference layer, and an uppermost capping layer. A carbon hard mask with a thickness $\geq 100$ nm, a silicon containing hard mask also known as a Si bottom anti-reflective coating (BARC) having a thickness of about 30 nm, and a photoresist layer are sequentially formed on the capping layer. The photoresist is patterned with a conventional photolithography method to generate an array comprised of a plurality of vias having a width d1 proximate to 80 nm. The vias are openings substantially in the desired shape (circle or oval) of the eventual MTJ cell. The openings are etch transferred through the Si BARC using a fluorocarbon plasma (RIE). Oxygen may be added to enlarge the openings to width d2 that is ≥100 nm. Thereafter, a second RIE step based on oxygen or a mixture of $O_2$ with a halogen such as $Cl_2$ or HBr is used to transfer the openings through the carbon hard mask and stop on the capping layer. The resulting via width d3 may be larger than d2 to facilitate a subsequent metal deposition process. The second RIE also removes the photoresist layer.

In the following step, the top electrode (TE) material is plated, or deposited by a physical deposition (PVD) method to fill the openings and form a TE layer on the Si BARC. A CMP process is performed at this point to remove the Si BARC and overlying TE layer so that the remaining TE material in the vias has a top surface coplanar with the carbon hard mask. The CMP involves a commercially available slurry that provides an etch rate for Ta and Si BARC that is substantially greater than that of the carbon hard mask, and in some embodiments, the etch rate ratio is as high as ≥80:1. As a result, the TE pillars and surrounding carbon hard mask have a thickness of at least 100 nm. Next, the carbon hard mask is stripped with an oxygen based plasma that may comprise $N_2$ or $H_2O$, or only oxygen to leave an array of TE pillars of width d3. Before the TE pattern is etch transferred through the MTJ stack of layers, the TE pillars are trimmed to the desired MTJ CD with an IBE where the angle of incident noble gas ions is preferably between 60 and 85 degrees with respect to a vertical plane. For example, the TE CD may be reduced to d4<60 nm while maintaining a TE height (thickness)≥70 nm, which is considerably greater than realized with prior art process flows where an overlying pattern in a BARC or hard mask is etch transferred through a top electrode layer.

Thereafter, the pattern of TE pillars is etch transferred through the underlying MTJ stack of layers by one or both of RIE and IBE such that the TE CD is essentially duplicated in the resulting MTJ cells. In some cases, the resulting TE and MTJ CDs are less than d4 while still maintaining a TE thickness≥70 nm. The etch process stops on a substrate that may be a bottom electrode in a MRAM or STT-MRAM. An encapsulation layer is deposited on MTJ cells to fill gaps between adjacent MTJ cells, and then a second CMP process is performed to remove all encapsulation material above the TE. The process flow described herein enables a larger process window for fabricating MTJ cells, especially with a CD<60 nm, and also enhances MRAM device yield and uniformity.

BRIEF DESCRIPTION OF THE DRAWINGS

FIG. 1 is a cross-sectional view of a photoresist pattern that has been formed over a MTJ stack of layers, a carbon hard mask, and an uppermost Si BARC according to a process of the present disclosure.

FIG. 2 is a cross-sectional view of the stack of layers in FIG. 1 after an etch step transfers the pattern through the Si BARC layer according to an embodiment of the present disclosure.

FIG. 3 is cross-sectional view of the stack of layers in FIG. 2 after a second etch process transfers the pattern through the carbon hard mask and removes the photoresist layer according to an embodiment described herein.

FIG. 7 is a cross-sectional view of the intermediate MTJ structure in FIG. 6 following an IBE trimming step to reduce the critical dimension of the TE pillar.

FIG. 8 is a cross-sectional view of a completed MTJ cell after one or more etch steps are used to transfer the TE pillar pattern in FIG. 7 through the MTJ stack of layers according to an embodiment of the present disclosure.

FIG. 9 is a cross-sectional view of the MTJ cell in FIG. 8 after an encapsulation layer is deposited and a second CMP process is performed to form a TE top surface that is coplanar with the encapsulation layer top surface.

DETAILED DESCRIPTION

Figure 4:
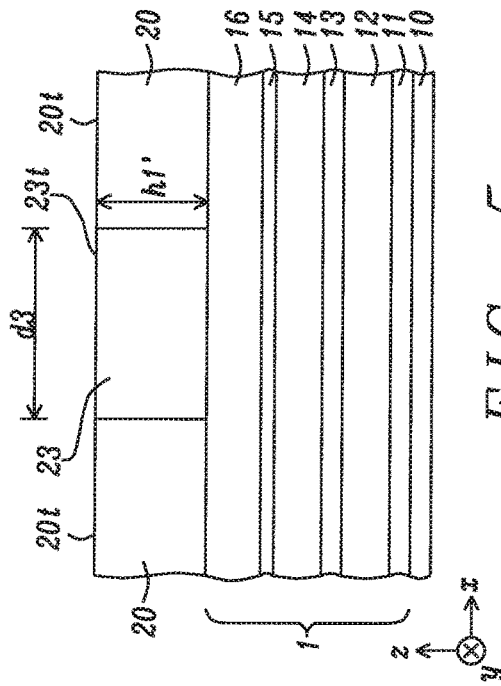
FIG. 4 is a cross-sectional view of the intermediate MTJ structure in FIG. 3 after a top electrode (TE) material is deposited to fill openings in the pattern.

The present disclosure is a process flow wherein an array of vias is formed in a photoresist layer, etch transferred through a Si BARC and carbon hard mask, and then filled with a top electrode (TE) material. After the Si BARC and carbon hard mask are removed and the resulting TE pillars are trimmed to reduce a CD below 60 nm, the TE pattern is transferred through an underlying MTJ stack of layers to generate an array of MTJ cells with a CD<60 nm. This "pattern first, TE deposit second" scheme provides an enhanced process window compared with the typical "TE deposit first, pattern second" approach in the prior art. Although the exemplary embodiments depict a MTJ stack of layers having a bottom spin valve configuration, the present disclosure also anticipates the resulting MTJ cells may have well known top spin valve or dual spin valve configurations. The MTJ cells may be used in MRAM or STT-MRAM applications, or as magnetoresistive (MR) sensors. Thickness or height of each layer relates to a z-axis direction, which is orthogonal to the planes of the MTJ layers that have a width in the x-axis direction and a length in the y-axis direction. A critical dimension may be in one or both of the x-axis and y-axis directions for elliptical and circular MTJ cells, respectively.

In related U.S. patent application Ser. No. 15/668,113, we disclosed a process flow wherein a photoresist pattern comprised of an array of island shapes is etch transferred through a BARC and then through a hard mask layer comprised of one or more of Ta, Ru, TaN, Ti, TiN, and W thereby forming a plurality of hard mask (TE) pillars. The hard mask pattern is subsequently duplicated in the underlying MTJ stack of layers with a RIE process in which plasma is generated from a combination of a noble gas (Ar) and an oxidant such as $CH_3OH$ to yield MTJ cells with CDs≤45 nm. Here we disclose an improved process flow for forming a TE pattern that leads to a larger process window for MTJ fabrication, especially for MTJ CDs<60 nm, as well as improved MRAM device yield and uniformity.

In FIG. 1, a MTJ stack 1 is shown after layers 11-16 are sequentially formed on a substrate 10 that in one embodiment is a bottom electrode (BE) in a memory device. However, the substrate may also be a bottom shield for a MR sensor in a read head as appreciated by those skilled in the art. The BE may be a multilayer structure comprising conductive metals and alloys such as Ta, TiN, and TaN, and is typically embedded in a dielectric layer (not shown).

In the exemplary embodiment, MTJ stack 1 has a bottom spin valve configuration wherein a seed layer 11, pinned or reference layer 12, tunnel barrier 13, free layer 14, metal oxide layer 15, and capping layer 16 are sequentially formed on the substrate. Each of the reference layer and free layer preferably have PMA with a magnetization aligned in a positive or negative z-axis direction. The metal oxide layer 15 is optional and is advantageously used to enhance PMA in the adjoining free layer. In an alternative embodiment, a metal layer such as Mo or W may be used in place of the metal oxide layer to enhance PMA in the free layer. Seed layer 11 may be comprised of one or more of NiCr, Ta, Ru, Ti, TaN, Cu, Mg, or other materials typically employed to promote a smooth and uniform grain structure in overlying layers, and increase PMA in the reference layer. Higher PMA in the reference layer and free layer translate into higher thermal stability for the MTJ cells in a MRAM or MR sensor device.

Reference layer 12 may have a synthetic anti-parallel (SyAP) configuration represented by AP2/Ru/AP1 where an anti-ferromagnetic coupling layer made of Ru, Rh, or Ir, for example, is sandwiched between an AP2 magnetic layer and an AP1 magnetic layer (not shown). The AP2 layer, which is also referred to as the outer pinned layer is formed on the seed layer while AP1 is the inner pinned layer and typically contacts the tunnel barrier. One or both of the AP1 and AP2 layers may be comprised of CoFe, CoFeB, Co, or a combination thereof. In other embodiments, one or both of the AP1 and AP2 layers may be a laminated stack with inherent PMA such as $(Co/Ni)_n$, $(CoFe/Ni)_n$, $(Co/NiFe)_n$, $(Co/Pt)_n$, $(Co/Pd)_n$, or the like where n is the lamination number. Furthermore, a transitional layer such as CoFeB or Co may be inserted between the AP1 laminated stack and the tunnel barrier layer.

The tunnel barrier layer 13 is preferably a metal oxide that is one or more of MgO, TiOx, AlTiO, MgZnO, Al₂O₃, ZnO, ZrOx, HfOx, or MgTaO. More preferably, MgO is selected as the tunnel barrier layer because it provides the highest magnetoresistive ratio, especially when sandwiched between two CoFeB layers, for example.

Free layer 14 may be Co, Fe, CoFe, or an alloy thereof with one or both of B and Ni, or a multilayer stack comprising a combination of the aforementioned compositions. In another embodiment, the free layer may have a non-magnetic moment diluting layer such as Ta or Mg inserted between two CoFe or CoFeB layers that are ferromagnetically coupled. In an alternative embodiment, the free layer has a SyAP configuration such as FL1/Ru/FL2 where FL1 and FL2 are two magnetic layers that are antiferromagnetically coupled, or is a laminated stack with inherent PMA described previously with respect to the reference layer composition.

Metal oxide layer 15 is also known as the Hk enhancing layer that increases PMA in the free layer. The metal oxide layer is typically selected from one of the compositions used for the tunnel barrier layer. However, the metal oxide layer usually has a lower oxidation state than in the tunnel barrier layer in order to reduce the resistance x area (RA) contribution to the overall RA product that is expressed as $RA_{TOTAL} = RA_{13} + RA_{15}$ where $RA_{13}$ and $RA_{15}$ are the RA contributions from the tunnel barrier layer 13 and metal oxide layer, respectively.

Capping layer 16 may be comprised of one or more of Ta and Ru, or another conductive metal or metal nitride used in the art. In some embodiments, conductive metal oxides such as RuOx, ReOx, IrOx, MnOx, MoOx, TiOx, or FeOx may be employed in the capping layer. All layers in the MTJ stack may be deposited in a DC sputtering chamber of a sputtering system such as an Anelva C-7100 sputter deposition system that includes ultra high vacuum DC magnetron sputter chambers with multiple targets and at least one oxidation chamber. Usually, the sputter deposition process involves argon sputter gas and a base pressure between $5 \times 10^{-8}$ and $5 \times 10^{-9}$ torr.

A carbon hard mask 20 is formed on capping layer 16 with a thickness h1 that is preferably ≥100 nm, and more preferably ≥150 nm. According to one embodiment, chemical vapor deposition (CVD) using a hydrocarbon precursor and a temperature in the range of 200° C. to 400° C. is used to deposit the carbon hard mask. Alternatively, a commercially available carbon based material such as fullerene or a derivative thereof is spin coated and baked to remove the casting solvent. Functional groups may be incorporated into the fullerene derivative to improve solubility in the solvent.

There is a Si containing hard mask 21 with a thickness h2 of about 30 nm formed on carbon hard mask 20. The Si hard mask serves as a bottom anti-reflective coating or Si BARC for the overlying photoresist layer 22. The Si BARC layer has a refractive index that minimizes reflection of light during a subsequent patternwise exposure (lithography process) that is used to form a pattern in the photoresist layer. In preferred embodiments, the Si BARC is a commercially available solution that is spin coated on the carbon hard mask and then baked to remove the solvent. The Si BARC may be comprised of a Si polymer as coated, or form a Si containing polymer by way of a cross-linking process during the bake step. Note that Si or polysilicon films are not hard mask candidates here since the CVD temperature used to deposit these films is generally above 500° C., which is not compatible with MRAM or sensor applications.

In some embodiments, an additional BARC (not shown) may be formed on the Si BARC. For example, if the overlying photoresist layer 22 will be exposed with a 193 nm wavelength, then an additional BARC may be chosen with a refractive index and thickness to minimize reflection of the 193 nm light off the BARC surface and back into the photoresist. The BARC is typically baked at a sufficiently high temperature proximate to 200° C. to remove all solvent and ensure that when the photoresist is coated thereon, there will be no intermixing of layers.

A lithography process comprised of a conventional patternwise exposure and developer sequence is employed to form a pattern having a plurality of via openings 30 arranged in rows and columns in the photoresist layer. Each opening has a height h3 proximate to 200 nm, and a width d1 around 80 nm. The photoresist layer is formed by spin coating a commercial photoresist solution available from multiple suppliers, and then baking to remove the solvent. The photoresist layer may be sensitive to one or more wavelengths including but not limited to 13 nm (EUV), 193 nm (ArF), and 248 nm (KrF) that transforms exposed regions into base soluble material that is removed by developer. In some embodiments, each opening 30 is circular wherein d1 is formed in both of the x-axis and y-axis directions. In other embodiments where each opening is an ellipse or polygon, d1 is formed only in the x-axis direction, and a dimension (not shown) in the y-axis direction is greater than d1.

Referring to FIG. 2, the pattern in photoresist layer 22 comprised of opening 30 is transferred through Si BARC layer 21 (or through both of the optional BARC layer and Si BARC) with a first RIE step based on a chlorocarbon gas, or fluorocarbon gas such as $CF_4$, $CHF_3$, or $C_4F_8$ wherein plasma 40 is directed essentially orthogonal to carbon hard mask top surface 20t. Moreover, oxygen may be flowed into the etch chamber during the RIE to form opening 30a having a width d2 where d2>d1, and that stops on top surface 20t. The photoresist layer is thinned to thickness h4 during the first RIE step.

As shown in FIG. 3, a second RIE step is performed wherein plasma 41 is generated from oxygen alone, or from a mixture of $O_2$ and one or more halogen-based gases including but not limited to HBr and $Cl_2$. Accordingly, an opening 30b of width d3 is formed within Si BARC 21 and carbon hard mask 20, and that stops on capping layer top surface 16t. Width d3 is greater than d2 and preferably at least 100 nm to facilitate a subsequent metal deposition process. The second RIE removes the photoresist layer and optional BARC layer and exposes top surface 21t on the Si BARC. Furthermore, plasma etch conditions such as the gas species and the radio frequency (RF) source/bias power may be tuned to generate a tapered sidewall 20s formed at an angle α that is from 70° to 90°. A non-vertical taper angle α is preferred to facilitate the subsequent metal deposition process of a top electrode material to fill the opening that has a greater width in a top portion thereof than at exposed top surface 16t.

Referring to FIG. 4, a key feature according to an embodiment of the present disclosure is the deposition of a TE layer 23 that fills the openings in the carbon hard mask pattern including opening 30b, and forms a thickness t of at least 150 nm such that a minimum point 23m on the non-uniform top surface of the TE layer is a greater height from substrate 10 than Si BARC top surface 21t. The TE layer is deposited by a conventional plating method or with a PVD process, and is comprised of one or more of Ta, TaN, Ti, TiN, W, Cu, Mg, Ru, Cr, Co, Fe, Ni, or alloys thereof.

Figure 5:
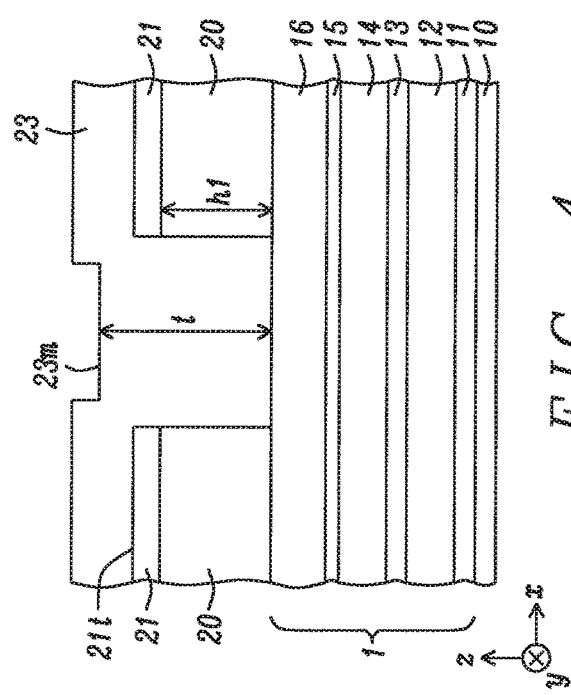
FIG. 5 is a cross-sectional view of the intermediate MTJ structure in FIG. 4 following a chemical mechanical polish (CMP) process to planarize a top surface and remove the Si BARC according to an embodiment of the present disclosure.

FIG. 5 depicts the intermediate MTJ structure in FIG. 4 after a CMP process is performed to remove the Si BARC (hard mask) 21 and all TE material above carbon hard mask top surface 20t. As a result, a plurality of TE pillars 23 is formed within the carbon hard mask layer 20 wherein height h1 in FIG. 4 may be reduced slightly to h1' that is preferably ≥100 nm for the TE pillars. According to one embodiment where the TE pillars have a Ta composition, a commercially available CMP slurry with a pH in the range of 10.9-11.2 is employed to provide a CMP polish rate selectivity of around 80:1 for Ta relative to the carbon hard mask, and 120:1 for the Si hard mask (HM) relative to the carbon hard mask as shown in Table 1. Thus, the thinning of the carbon hard mask from h1 to h1' during the CMP process may be limited to 10 nm or less in some embodiments.

TABLE 1

| CMP polish rates for TE pillar (Ta), Si BARC, and carbon hard mask with pH 10.9-11.2 slurry | | | | |
|---|---|---|---|---|
| Ta (/min.) | Si HM (/min) | Carbon HM (/min) | Selectivity Ta/C HM | Selectivity Si HM/C HM |
| 800 | 1200 | 10 | 80:1 | 120:1 |

Figure 6:
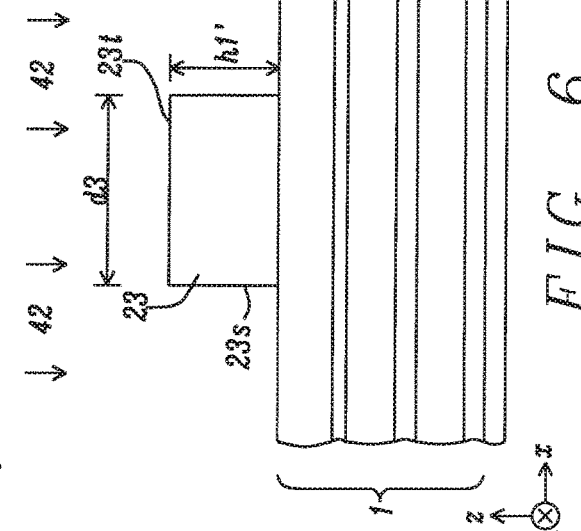
FIG. 6 is a cross-sectional view of the intermediate MTJ structure in FIG. 5 after an oxygen ashing step to remove the carbon hard mask.

Thereafter, in FIG. 6, the carbon hard mask is removed with plasma 42 comprised of oxygen species that may be generated from $O_2$ alone or a mixture of oxygen with $N_2$ or $H_2O$. The RIE step stops on top surface 16t of capping layer 16. Meanwhile, width d3 and height h1' are essentially maintained in TE pillar 23. A limited amount of oxidation may occur at sidewall 23s and top surface 23t. However, this TE oxide is removed in the following trimming step.

Referring to FIG. 7, TE pillar 23 (and a plurality of other TE pillars in the array) is trimmed to width d4 that is preferably ≤60 nm with an IBE process according to one embodiment. A new sidewall 23s1 and top surface 23t1 are formed, and TE pillar thickness is reduced somewhat to h5. With IBE, incident ions 43 of a noble gas that is one or more of Ar, Kr, Ne, and Xe are directed at angle θ between 60° and 85° with respect to the z-axis direction. It should be understood that the etch rate during trimming is dependent on the angle of incidence where ions at a substantially horizontal angle θ of 80° provide an etch rate of 0.67 Angstroms/sec on the TE sidewall. At the same angle θ, there is a vertical etch rate of only 0.1 Angstroms/sec on the TE top surface. Thus, the horizontal/vertical etch selectivity in a preferred embodiment is 6.7:1 meaning that the width (CD) may be reduced from d3 of 100 nm to d4=60 nm while the height h1' of 100 nm is thinned only to h5=94 nm. If the IBE process is lengthened to achieve a d4 considerably smaller than 60 nm, h5 will still be ≥70 nm according to the process flow of the present disclosure. Note that the original carbon hard mask thickness h1 may be increased to 130 nm or more if h5≥100 nm is preferred.

During an IBE process, the wafer (not shown) on which the MTJ stack of layers and plurality of TE pillars is formed is typically rotated. IBE comprises a voltage of 50 eV to 400 eV, and in some embodiments, the incident angle θ may be swept back and forth between a maximum and a minimum value. Furthermore, the present disclosure anticipates that oxygen may be added to the noble gas during IBE to generate ions 43.

In an alternative embodiment, the trimming process shown in FIG. 7 may comprise both IBE and RIE. In particular, RIE based on Ar or a fluorocarbon gas may be employed to remove residue that builds up as a result of IBE. RIE is performed without rotating the wafer and plasma is directed orthogonal (θ=0°) to top surface 16t of capping layer 16. Thus, the trimming process may comprise a first IBE step and a second RIE step.

Referring to FIG. 8, the TE pillar pattern is etch transferred through the underlying stack of MTJ layers 11-16 and stops on substrate top surface 10t. TE pillar 23 serves as an etch mask and is thinned to thickness h6 of ≥70 nm. As we described in related U.S. patent application Ser. No. 15/668,113, the MTJ etch 44 may comprise a physical component that is ions (and plasma) from a noble gas, and a chemical component made of ions and plasma from a chemical (oxidant) species that are generated with RIE or IBE conditions. In a RIE embodiment, both of a noble gas and one or more oxidants including methanol, ethanol, $NH_3$, $N_2O$, $H_2O_2$, $H_2O$, $O_2$, and CO are fed into an etch chamber while a plasma is induced with a RF power at a temperature between room temperature and 80° C. The resulting ions and plasma are directed essentially orthogonal to the top surface 10t of the substrate along the z-axis direction in a RIE process such that sidewall 23s2 is formed coplanar with sidewall 1s on the resulting MTJ cell. Moreover, the combined physical and chemical etching provides for a sidewall 1s with minimal damage and substantially free of residue. There may be a main etch step during a first period of time that stops when an end point is reached according to a plot of time vs. signal intensity detected by optical emission spectroscopy, for example, and an over etch step during a second period of time in a RIE process. Accordingly, the CD for TE pillar 23 may be reduced from d4 to d5 during the MTJ etch such that both of the TE pillar and underlying MTJ 1a have a CD≤60 nm.

The RIE process chamber may comprise an upper electrode, a lower electrode (electrostatic chuck) on which one or more wafers are held in place, and a gap between each wafer and upper electrode (not shown). Preferably, a first RF power between 600 and 3000 Watts is applied to the upper electrode, and a second RF power from 400 to 3000 Watts is applied to the lower electrode in order to generate and sustain plasma in the gap between the two electrodes. In addition, the RIE chamber pressure must be sufficiently high enough to sustain a stable plasma, but preferably is not more than 3 mTorr.

In an alternative embodiment, the aforementioned RIE process also comprises an optional etching step performed after the main MTJ etch wherein a plasma is generated with a RF or DC power ≤100 Watts and pure noble gas or with a combination of noble gas and one or more oxidants described previously. The plasma is directed orthogonal to the substrate in an etch chamber that may be in the same mainframe as employed for a subsequent encapsulation process. The optional etch step is incorporated in the MTJ etch process flow as a cleaning measure to ensure that sidewall 1s and substrate top surface 10t are substantially free of residue.

Alternatively, when IBE is employed to generate ions 44 for the etch transfer process, the ions preferably have an incident angle with respect to a vertical plane (not shown) of 30° to 50° to minimize TE redeposition on sidewall 23s2 and sidewall 1s. In other embodiments, both of IBE and RIE may be used for the MTJ etch in FIG. 8.

In all embodiments, CD d5 in TE 23 is effectively duplicated in MTJ1a. A key feature is that TE thickness h6 of at least 70 nm is substantially greater than realized in the prior art for a MTJ CD below 60 nm. Accordingly, the process flow of the present disclosure provides a larger process window for fabricating an array of MTJ cells than with other methods known in the art.

Referring to FIG. 9, an encapsulation layer 25 that is comprised of a dielectric material is deposited on substrate top surface 10t and over TE 23 and the array of MTJ cells each having sidewall 1s. The encapsulation layer may comprise one or more layers and fills the gaps between adjacent MTJ cells. In one embodiment, a first encapsulation layer 25a with a thickness d1 from 5 to 250 Angstroms is conformally deposited on top surface 10t, and adjoins sidewalls 1s, 23s, and top surface 23t2. Then a second encapsulation layer 25b having a thickness d2 up to 2000 Angstroms is deposited on the first encapsulation layer. Each of layers 25a, 25b may be one or more of SiN, $SiO_2$, SiON, SiC, TaOx, MgO, $Al_2O_3$, AlN, BN, or the like that is deposited by physical vapor deposition (PVD), chemical vapor deposition (CVD), ion beam deposition (IBD), or atomic layer deposition (ALD). When the optional plasma etching step is employed for cleaning purposes as mentioned previously, the encapsulation process is preferably performed without breaking the vacuum in the process chamber used for the plasma cleaning. Thereafter, a second chemical mechanical polish (CMP) process is performed to form a top surface 25t on the encapsulation layer that is coplanar with top surface 23t2 on TE 23.

Figure 10:
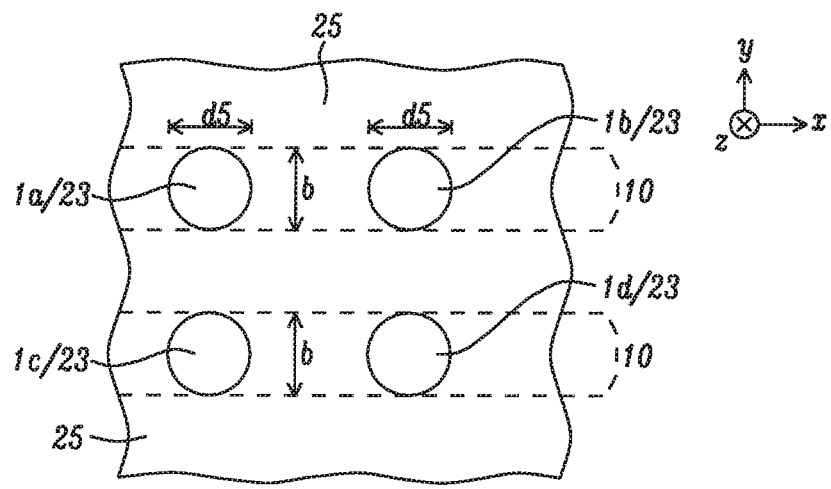
FIG. 10 shows a top-down view of a plurality of MTJ cells surrounded by an encapsulation layer according to an embodiment of the present disclosure.

Referring to FIG. 10, the plurality of island shapes comprised of the MTJ cells (layers 11-16) and overlying TE 23 formed by the process flow of the present disclosure is depicted from a top-down view after the second CMP or an alternative planarization step. MTJ cell 1a is shown in the same row as MTJ cell 1b, and MTJ cells 1c, 1d are in the same column as MTJ cells 1a and 1b, respectively. As explained previously, the MTJ cells are depicted with a circular shape but may have elliptical shapes in other embodiments. Each of the MTJ cells and overlying TE shown as stack 1a/23, for example, has a first CD d5 in the x-axis direction, and a second CD b in the y-axis direction where b may be equal to d5 for circular shapes, or greater than d5 for elliptical shapes (not shown). Generally, millions of MTJ cells are formed in an array but only four are illustrated here to simplify the drawing.

Thereafter, a top electrode layer comprised of a plurality of parallel conductive lines (not shown) is formed by a conventional method on the MTJ/TE stacks and encapsulation layer 25 as appreciated by those skilled in the art. A first top conductive line may contact a TE top surface above MTJ cells 1a, 1c while a second conductive line contacts a TE top surface above MTJ cells 1b, 1d. Conductive lines in the top electrode layer are preferably formed along the y-axis direction that is orthogonal to the conductive lines along the x-axis direction in the bottom electrode layer.

In addition to the larger process windows for MTJ etch and CMP processes, the present disclosure provides enhanced yields of MRAM devices and MR sensors and improves CD uniformity for MRAM devices on a wafer, and from wafer to wafer. All processes described herein are performed with existing tools and materials thereby requiring no capital outlay for new equipment.

While this disclosure has been particularly shown and described with reference to, the preferred embodiment thereof, it will be understood by those skilled in the art that various changes in form and details may be made without departing from the spirit and scope of this disclosure.

What is claimed is:

1. A method, comprising:
   forming a magnetic tunnel junction (MTJ) stack on a bottom electrode;
   forming a hard mask layer on the MTJ stack;
   forming an opening in the hard mask layer, the opening having a first dimension measured in a direction parallel to a top surface of the MTJ stack;
   filling the opening with a conductive material;
   after filling the opening, removing the hard mask layer to expose sidewalls of the conductive material;
   trimming the conductive material to form a top electrode (TE) pillar, the TE pillar having a second dimension, the second dimension being measured in the direction parallel to the top surface of the MTJ stack, the second dimension being less than the first dimension; and
   etching the MTJ stack using the TE pillar as an etch mask, the etching of the MTJ stack exposing a top surface of the bottom electrode.

2. The method of claim 1, wherein the hard mask layer includes carbon.

3. The method of claim 1, wherein the second dimension is less than or equal to about 60 nanometers.

4. The method of claim 1, wherein a height of the TE pillar is substantially equal to 100 nm prior to the etching of the MTJ stack, the height being measured in a direction perpendicular to the top surface of the MTJ stack.

5. The method of claim 4, wherein the etching of the MTJ stack causes the height of the TE pillar to be less than about 100 nm.

6. The method of claim 1, wherein the trimming of the conductive material is performed with an ion beam etch, the ion beam etch having an incident beam angle from about 60 degrees to about 85 degrees with respect to a direction perpendicular to the top surface of the MTJ stack.

7. The method of claim 1, wherein the removing of the hard mask layer is performed with a reactive ion etch (RIE) including an oxygen plasma.

8. The method of claim 1, wherein the removing of the hard mask layer is performed with a reactive ion etch (RIE) generated from a mixture of oxygen with $N_2$ or $H_2O$.

9. The method of claim 1, wherein the conductive material is selected from the group consisting of Ta, TaN, Ti, TiN, W, Cu, Mg, Ru, Cr, Co, Fe, Ni, and combinations thereof.

10. A method, comprising:
    forming a magnetic tunnel junction (MTJ) stack of layers on a bottom electrode, wherein the MTJ stack of layers includes a reference layer, a tunnel barrier layer over the reference layer, a free layer over the tunnel barrier layer, and a capping layer over the free layer;
    forming a carbon-containing hard mask (HM) layer over the capping layer;
    forming a silicon-containing HM layer over the carbon-containing HM layer;
    forming a photoresist layer over the silicon-containing HM layer;
    forming a first opening having a width d1 in the photoresist layer;
    etching the silicon-containing HM layer through the first opening to form a second opening having a width d2 in the silicon-containing HM layer, wherein the width d2 is greater than the width d1;
    etching the carbon-containing HM layer through the second opening to form a third opening having a width d3 in the carbon-containing HM layer, wherein the width d3 is greater than the width d2, wherein the etching of the carbon-containing HM layer removes the photoresist layer;
    filling the third opening with a conductive material;
    polishing the conductive material to form a top electrode in the carbon-containing HM layer, the polishing removing the silicon-containing HM layer;
    removing the carbon-containing HM layer to expose sidewalls of the top electrode;
    trimming the top electrode such that the top electrode has a width d4 that is less than or equal to about 60 nm; and
    etching the MTJ stack of layers using the top electrode as an etch mask.

11. The method of claim 10, wherein the width d3 is greater than or equal to about 100 nanometers.

12. The method of claim 10, wherein the etching of the silicon-containing HM layer includes a first reactive ion etch (RIE) step, the first RIE step including a plasma generated from a fluorocarbon gas or a chlorocarbon gas.

13. The method of claim 10, wherein the etching of the carbon-containing HM layer includes a second reactive ion etch (RIE) step, the second RIE step includes a plasma generated from an oxygen-containing fluid.

14. The method of claim 13, wherein the oxygen-containing fluid is $O_2$ gas or a mixture of $O_2$ gas with at least one of $Cl_2$ or HBr.

15. The method of claim 10, wherein the polishing of the conductive material includes using a slurry with a pH from about 10.9 to 11.2 such that a polish rate ratio of the conductive material relative to the carbon-containing HM layer is about 80:1, and a polish rate ratio of the silicon-containing HM layer relative to the carbon-containing HM layer is about 120:1.

16. The method of claim 10, wherein the conductive material is selected from the group consisting of Ta, TaN, Ti, TiN, W, Cu, Mg, Ru, Cr, Co, Fe, Ni, and combinations thereof.

17. The method of claim 10, wherein the removing of the carbon-containing HM layer includes using a plasma that is generated from oxygen or from oxygen mixed with $N_2$ or $H_2O$.

18. A method, comprising:
    providing a magnetic tunnel junction (MTJ) stack of layers on a bottom electrode;
    forming a first hard mask (HM) layer on a top surface of the MTJ stack of layers;
    forming a second HM layer on a top surface of the first HM layer;
    forming an opening extending through the first HM layer and the second HM layer, the opening having a width that is greater than or equal to about 100 nanometers, the opening having a tapered sidewall, wherein an angle subtended between the tapered sidewall and the top surface of the MTJ stack of layers is in a range from about 70 degrees to about 90 degrees;
    filling the opening with a conductive material to form a top electrode pillar;
    removing the first HM layer and the second HM layer to expose sidewalls of the top electrode pillar;
    trimming the top electrode pillar using an etch process, the trimming causing the top electrode pillar to have a first width that is less than about 60 nanometers; and
    etching the MTJ stack of layers using the top electrode pillar as an etch mask, the etching causing the top electrode pillar to have a second width that is less than the first width.

19. The method of claim 18, wherein the trimming of the top electrode pillar includes an ion beam etch (IBE) including a fluid selected from the group consisting of Ar, Kr, Ne, Xe, and combinations thereof, and wherein ion beams of the IBE are directed at the top electrode pillar at an incident angle that is in a range from about 60 degrees to 85 degrees with respect to a plane that is orthogonal to a top surface of the bottom electrode.

20. The method of claim 18, wherein the etching of the MTJ stack of layers includes a reactive ion etch (RIE) process including a plasma generated from a noble gas reactant and an oxidant, the oxidant being selected from the group consisting of methanol, ethanol, $NH_3$, $N_2O$, $H_2O_2$, $H_2O$, $O_2$, CO, and combinations thereof.

* * * * *